United States Patent
Hu

(10) Patent No.: US 8,457,326 B2
(45) Date of Patent: Jun. 4, 2013

(54) OUTPUT CIRCUIT FOR AUDIO CODEC CHIP

(75) Inventor: Ke-You Hu, Shenzhen (CN)

(73) Assignees: Hong Fu Jin Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 873 days.

(21) Appl. No.: 12/617,962

(22) Filed: Nov. 13, 2009

(65) Prior Publication Data

US 2011/0060593 A1    Mar. 10, 2011

(30) Foreign Application Priority Data

Sep. 9, 2009   (CN) .................. 2009 2 0309961 U

(51) Int. Cl.
*H04B 15/00* (2006.01)

(52) U.S. Cl.
USPC .................. 381/94.6; 381/94.1; 381/94.5

(58) Field of Classification Search
USPC ........ 381/94.5, 306, 72, 74; 700/94; 330/901, 330/182, 281, 315; 455/194.1, 218
See application file for complete search history.

(56) References Cited

U.S. PATENT DOCUMENTS

| | | | |
|---|---|---|---|
| 2007/0093221 A1* | 4/2007 | Kato | 455/194.1 |
| 2007/0168183 A1* | 7/2007 | Van De Kerkhof | 704/200.1 |
| 2010/0158270 A1* | 6/2010 | Chao et al. | 381/94.5 |

* cited by examiner

*Primary Examiner* — Mohammad Islam
*Assistant Examiner* — David Ton
(74) *Attorney, Agent, or Firm* — Altis Law Group, Inc.

(57) ABSTRACT

An output circuit for audio codec chip includes a noise eliminating circuit electrically coupled to the audio codec chip for eliminating noise signals. The noise eliminating circuit includes a first switch and a second switch. When the audio codec chip output signals jump from low voltage level to high voltage level, the noise signals are grounded via the first and second switches respectively.

4 Claims, 2 Drawing Sheets

OUTPUT CIRCUIT FOR AUDIO CODEC CHIP

BACKGROUND

1. Technical Field

The present disclosure relates to output circuits, and particularly to an output circuit for an audio codec chip.

2. Description of Related Art

In computer systems, audio codec chips are positioned on the motherboards for outputting and receiving audio signals. A typical audio codec chip is electrically coupled to and communicates with a plurality of peripheral devices directly, e.g. speaker, earphone, and so on. However, when the computer system is awakened from the sleep mode, the audio codec chip output signals jump from low voltage level to high voltage level, e.g. increases from 0 volt to 2.5 volts. This rapid voltage level change has a remarkable influence on the peripheral devices, and generates large amounts of noise signals.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
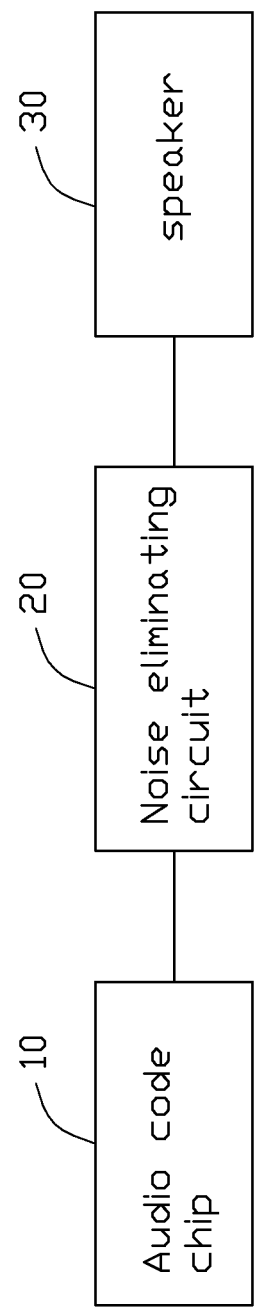
FIG. 1 is a block diagram of an output circuit for an audio codec chip, in accordance with an embodiment.
Figure 2:
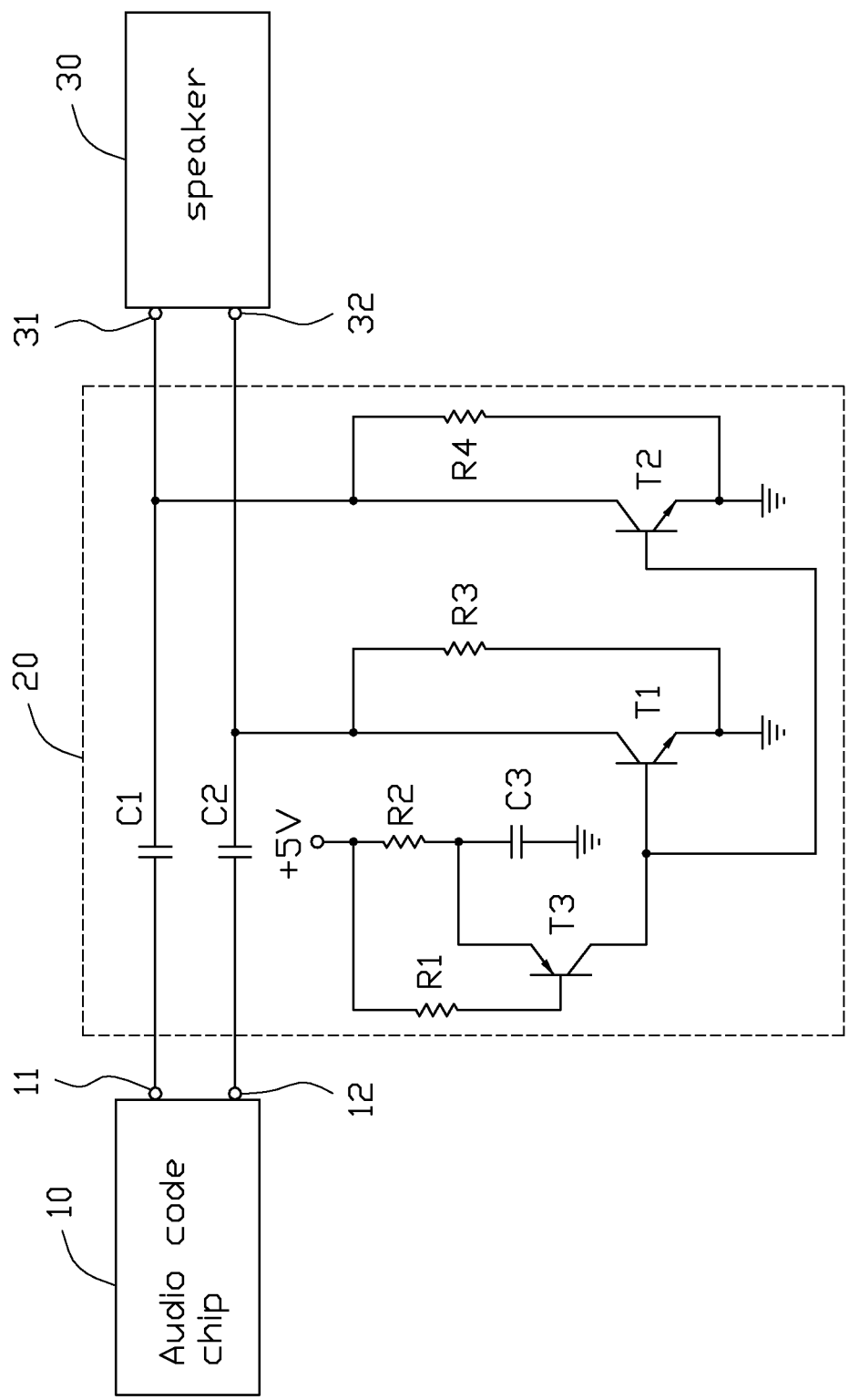
FIG. 2 is a circuit diagram of the output circuit for the audio codec chip of FIG. 1.

Referring to FIG. 1 and FIG. 2, an output circuit for an audio codec chip 10 includes a noise eliminating circuit 20 and a peripheral device 30. The audio codec chip 10 includes an L-channel analog signal output terminal 11 and an R-channel analog signal output terminal 12. The peripheral device 30 includes an L-channel analog signal input terminal 31 and an R-channel analog signal input terminal 32. The L-channel analog signal output terminal 11 is electrically coupled to the L-channel analog signal input terminal 31 via the noise eliminating circuit 20. The R-channel analog signal output terminal 12 is electrically coupled to the R-channel analog signal input terminal 32 via the noise eliminating circuit 20. In one embodiment, the peripheral device 30 is a speaker.

The noise eliminating circuit 20 includes a first capacitor C1, a second capacitor C2, a third capacitor C3, a first resistor R1, a second resistor R2, a third resistor R3, a fourth resistor R4, a first switch T1, a second switch T2 and a third switch T3. The first and second switches T1, T2 are NPN type transistors, the third switch T3 is a PNP type transistor.

The first switch base is electrically coupled to the third switch collector. The first switch collector is electrically coupled to the second capacitor first terminal. The second capacitor second terminal is electrically coupled to the R-channel analog signal output terminal 12. The first switch emitter is grounded. The first switch emitter is electrically coupled to the third resistor first terminal. The third resistor second terminal is electrically coupled to the first switch collector. The second switch base is electrically coupled to the third switch collector. The second switch collector is electrically coupled to the first capacitor first terminal. The first capacitor second terminal is electrically coupled to the L-channel analog signal output terminal 11. The second switch emitter is grounded. The second switch emitter is electrically coupled to the fourth resistor first terminal. The fourth resistor second terminal is electrically coupled to the second switch collector. The third switch base is electrically coupled to the first resistor first terminal. The third switch emitter is electrically coupled to the second resistor first terminal. The first resistor second terminal and the second resistor second terminal respectively receive a +5 volts voltage. The third switch emitter is electrically coupled to the third capacitor first terminal. The third capacitor second terminal is grounded.

In use, when the computer system is awakened from the sleep mode, the L-channel and R-channel analog signal output terminals 11, 12 output signals jump from 0 volts to 2.5 volts. The third switch T3 receives the +5 volts voltage and is turned on. The +5 volts voltage is provided to the first and second switches bases respectively. The normal audio signals from the audio codec chip 10 are at a low voltage level. The first and second switches collectors receive the low voltage level and are turned off. Therefore, the normal audio signals from the L-channel and R-channel analog signal output terminals 11, 12 can be transmitted to the peripheral device 30 via the first and second capacitors C1, C2 respectively. The noise signals from the audio codec chip 10 are at a high voltage level. The first and second switches collectors receive the high voltage level and are turned on. Therefore, the noise signals from the L-channel and R-channel analog signal output terminals 11, 12 can be grounded via the first and second switches T1, T2 respectively.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An output circuit for audio codec chip, comprising:
a noise eliminating circuit electrically coupled to the audio codec chip for eliminating noise signals; the noise eliminating circuit comprising a first switch and a second switch, wherein when the audio codec chip output signals jump from low voltage level to high voltage level, the noise signals are grounded via the first and the second switches respectively; wherein the audio codec chip comprises an L-channel analog signal output terminal and an R-channel analog signal output terminal; the L-channel and the R-channel analog signal output terminals are grounded via the first and the second switches respectively; the noise eliminating circuit further comprises a first capacitor and a second capacitor; the L-channel analog signal output terminal is electrically coupled to the first capacitor first terminal; the first capacitor second terminal is electrically coupled to the first switch; the R-channel analog signal output terminal is electrically coupled to the second capacitor first terminal; and the second capacitor second terminal is electrically coupled to the second switch; the noise eliminating circuit further comprises a third switch; and the first and second switches receive an input voltage via the third switch; the first, the second and the third switches are transistors; the first switch base is electrically coupled to the third switch collector; the first switch collector is electrically coupled to the second capacitor first terminal; the second capacitor second terminal is electrically coupled to the R-channel analog signal output terminal; and the first switch emitter is grounded; the first and the second switches are NPN type transistors; and the third switch is a PNP type transistor.

2. An output circuit for audio codec chip, comprising:

a noise eliminating circuit electrically coupled to the audio codec chip for eliminating noise signals; the noise eliminating circuit comprising a first switch and a second switch, wherein when the audio codec chip output signals jump from low voltage level to high voltage level, the noise signals are grounded via the first and the second switches respectively; wherein the audio codec chip comprises an L-channel analog signal output terminal and an R-channel analog signal output terminal; the L-channel and the R-channel analog signal output terminals are grounded via the first and the second switches respectively; the noise eliminating circuit further comprises a first capacitor and a second capacitor; the L-channel analog signal output terminal is electrically coupled to the first capacitor first terminal; the first capacitor second terminal is electrically coupled to the first switch; the R-channel analog signal output terminal is electrically coupled to the second capacitor first terminal; and the second capacitor second terminal is electrically coupled to the second switch; the noise eliminating circuit further comprises a third switch; and the first and second switches receive an input voltage via the third switch; the first, the second and the third switches are transistors; the first switch base is electrically coupled to the third switch collector; the first switch collector is electrically coupled to the second capacitor first terminal; the second capacitor second terminal is electrically coupled to the R-channel analog signal output terminal, and the first switch emitter is grounded; the second switch base is electrically coupled to the third switch collector; the second switch collector is electrically coupled to the first capacitor first terminal; the first capacitor second terminal is electrically coupled to the L-channel analog signal output terminal; and the second switch emitter is grounded; the third switch base is electrically coupled to a first resistor first terminal; the third switch emitter is electrically coupled to a second resistor first terminal; and the first resistor second terminal and the second resistor second terminal receive the input voltage.

3. The output circuit for audio codec chip of claim 2, wherein the noise eliminating circuit further comprises a third resistor, a fourth resistor and a third capacitor; the first switch emitter is electrically coupled to the third resistor first terminal; the third resistor second terminal is electrically coupled to the first switch collector; the second switch emitter is electrically coupled to the fourth resistor first terminal; the fourth resistor second terminal is electrically coupled to the second switch collector; the third switch emitter is electrically coupled to the third capacitor first terminal; and the third capacitor second terminal is grounded.

4. An output circuit for audio codec chip, comprising:

a noise eliminating circuit electrically coupled to the audio codec chip for eliminating noise signals; the noise eliminating circuit comprising a first switch and a second switch, wherein when the audio codec chip output signals jump from low voltage level to high voltage level, the noise signals are grounded via the first and the second switches respectively; wherein the audio codec chip comprises an L-channel analog signal output terminal and an R-channel analog signal output terminal; the L-channel and the R-channel analog signal output terminals are grounded via the first and the second switches respectively; the noise eliminating circuit further comprises a first capacitor and a second capacitor; the L-channel analog signal output terminal is electrically coupled to the first capacitor first terminal; the first capacitor second terminal is electrically coupled to the first switch; the R-channel analog signal output terminal is electrically coupled to the second capacitor first terminal; and the second capacitor second terminal is electrically coupled to the second switch; the noise eliminating circuit further comprises a third switch; and the first and second switches receive an input voltage via the third switch; and the input voltage is +5 volts.

* * * * *